§
US008475625B2

(12) United States Patent
Pamarthy et al.

(10) Patent No.: US 8,475,625 B2
(45) Date of Patent: Jul. 2, 2013

(54) APPARATUS FOR ETCHING HIGH ASPECT RATIO FEATURES

(75) Inventors: Sharma Pamarthy, Hayward, CA (US); Huutri Dao, San Jose, CA (US); Xiaoping Zhou, San Jose, CA (US); Kelly A. McDonough, San Jose, CA (US); Jivko Dinev, Cupertino, CA (US); Farid Abooameri, San Ramon, CA (US); David E. Gutierrez, San Jose, CA (US); Jim Zhongyi He, Sunnyvale, CA (US); Robert S. Clark, San Jose, CA (US); Dennis M. Koosau, Hayward, CA (US); Jeffrey William Dietz, San Jose, CA (US); Declan Scanlan, Sunnyvale, CA (US); Subhash Deshmukh, San Jose, CA (US); John P. Holland, San Jose, CA (US); Alexander Paterson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 910 days.

(21) Appl. No.: 11/381,523

(22) Filed: May 3, 2006

(65) Prior Publication Data

US 2007/0256785 A1 Nov. 8, 2007

(51) Int. Cl.
*H01L 21/3065* (2006.01)

(52) U.S. Cl.
USPC .................. 156/345.33; 156/345.24; 438/689; 118/715

(58) Field of Classification Search
USPC .......... 156/345.33, 345.24; 118/715; 438/689
See application file for complete search history.

(56) References Cited

U.S. PATENT DOCUMENTS

| 5,427,621 A | * | 6/1995 | Gupta .................................. 134/1 |
| 5,549,756 A | * | 8/1996 | Sorensen et al. .............. 118/715 |
| 5,910,221 A | | 6/1999 | Wu |
| 6,059,885 A | * | 5/2000 | Ohashi et al. .................. 118/730 |
| 6,110,556 A | | 8/2000 | Bang et al. |
| 6,159,297 A | | 12/2000 | Herchen et al. |
| 6,209,480 B1 | * | 4/2001 | Moslehi ..................... 118/723 I |
| 6,390,019 B1 | * | 5/2002 | Grimbergen et al. ..... 118/723 R |
| 6,551,445 B1 | | 4/2003 | Yokogawa et al. |
| 6,562,186 B1 | | 5/2003 | Saito et al. |

(Continued)

FOREIGN PATENT DOCUMENTS

| JP | A-2001-217227 | 8/2001 |
| TW | 096115650 | 5/2007 |

OTHER PUBLICATIONS

Official Letter dated Nov. 23, 2011, from Taiwan Patent Office for corresponding Taiwan Patent Application No. 096115649.

(Continued)

*Primary Examiner* — Jeffrie R Lund
*Assistant Examiner* — Satish Chandra
(74) *Attorney, Agent, or Firm* — Patterson & Sheridan, LLP (57) ABSTRACT

Embodiments of the invention provide a method and apparatus, such as a processing chamber, suitable for etching high aspect ratio features. Other embodiments include a showerhead assembly for use in the processing chamber. In one embodiment, a processing chamber includes a chamber body having a showerhead assembly and substrate support disposed therein. The showerhead assembly includes at least two fluidly isolated plenums, a region transmissive to an optical metrology signal, and a plurality of gas passages formed through the showerhead assembly fluidly coupling the plenums to the interior volume of the chamber body.

22 Claims, 8 Drawing Sheets

U.S. PATENT DOCUMENTS

| | | | |
|---|---|---|---|
| 6,713,127 B2 * | 3/2004 | Subramony et al. | 427/255.37 |
| 6,755,932 B2 * | 6/2004 | Masuda et al. | 156/345.24 |
| 6,818,096 B2 | 11/2004 | Barnes et al. | |
| 6,942,929 B2 * | 9/2005 | Han et al. | 428/650 |
| 6,983,892 B2 | 1/2006 | Noorbakhsh et al. | |
| 7,163,585 B2 * | 1/2007 | Nishimoto et al. | 118/715 |
| 2004/0027781 A1 * | 2/2004 | Hanawa et al. | 361/234 |
| 2004/0149699 A1 | 8/2004 | Hofman et al. | |
| 2004/0173155 A1 * | 9/2004 | Nishimoto et al. | 118/715 |
| 2004/0191545 A1 * | 9/2004 | Han et al. | 428/472 |
| 2004/0206305 A1 | 10/2004 | Choi et al. | |
| 2005/0016684 A1 * | 1/2005 | Sun et al. | 156/345.51 |
| 2005/0056218 A1 * | 3/2005 | Sun et al. | 118/715 |
| 2005/0067103 A1 | 3/2005 | Nguyen et al. | |
| 2005/0072526 A1 | 4/2005 | Nguyen et al. | |
| 2005/0136657 A1 | 6/2005 | Yokoi et al. | |
| 2005/0173569 A1 | 8/2005 | Noorbakhsh et al. | |
| 2005/0271814 A1 * | 12/2005 | Chang et al. | 427/248.1 |
| 2005/0276566 A1 * | 12/2005 | Iimura | 385/146 |
| 2006/0073690 A1 * | 4/2006 | Brown et al. | 438/597 |
| 2006/0076109 A1 * | 4/2006 | Holland et al. | 156/345.27 |
| 2007/0215580 A1 | 9/2007 | Koshiishi et al. | |

OTHER PUBLICATIONS

Official Letter dated Apr. 11, 2012 from TIPO for TW Application No. 96115649.
Official Letter dated Aug. 16, 2012 for Taiwanese Patent Application No. 96115649.
Official Letter dated May 21, 2010, from the State Intellectual Property Office of the People's Republic of China for corresponding Chinese Patent Application No. 200780000208.1.
PCT Search Report and Written Opinion in PCT/US07/68063, dated Dec. 2, 2008, Applied Materials, Inc., Applicant, 14 pages.
Official Letter dated Nov. 30, 2011, from Japanese Patent Office for corresponding Japan Patent Application no. 2009-510059.
Official Letter dated Mar. 5, 2013 from the Taiwan Patent Office for corresponding Taiwan Patent Application No. 96115649.

* cited by examiner

APPARATUS FOR ETCHING HIGH ASPECT RATIO FEATURES

BACKGROUND OF THE INVENTION

1. Field of the Invention

Embodiments of the invention generally relate to a vacuum processing chamber for etching high aspect ratio feature in semiconductor substrates and the like.

2. Description of the Related Art

The demand for faster, more powerful integrated circuits (IC) devices has introduced new challenges for IC fabrication technology, including the need to etch high aspect ratio of features such as trenches or vias on a substrate such as a semiconductor wafer. For example, deep trench storage structures used in some dynamic random access memory applications require deep high aspect ratio trenches etched into a semiconductor substrate. Deep silicone trench etching is typically carried out in a reactive ion etching (RIE) process utilizing silicon oxide mask.

One conventional system which has shown robust performance in etching high aspect ratio features is the CENTURA HART™ Etch System, available from Applied Materials, inc. located in Santa Clara, Calif. The HART™ etching system utilizes a MERIE reactor capable of etching trenches having aspect ratios up to 70:1 while maintaining trench depth uniformity of 5 percent from center to edge. However, in order to enable fabrication of integrated circuits having sub-90 nm critical dimensions, circuit designers have demanded improved uniformity trench uniformity at event high aspect ratios. Thus, it would be desirable to improve etching performance to enable the realization of next generation devices.

Therefore, there is a need for an improved apparatus for etching high aspect ratio features.

SUMMARY OF THE INVENTION

Embodiments of the invention provide a method and apparatus, such as a processing chamber, suitable for etching high aspect ratio features. Other embodiments include a showerhead assembly for use in the processing chamber.

In one embodiment, a processing chamber includes a chamber body having a showerhead assembly and substrate support assembly disposed therein. The showerhead assembly includes at least two fluidly isolated plenums, a region transmissive to an optical metrology signal, and a plurality of gas passages formed through the showerhead assembly fluidly coupling the plenums to the interior volume of the chamber body.

In another embodiment, a processing chamber includes a chamber body having a showerhead assembly and substrate support assembly disposed therein. The showerhead assembly includes an inner gas flow zone, an outer gas flow zone, and a region transmissive to an optical metrology signal. The inner and outer zones are fluidly isolated from each other. The substrate support assembly includes at least two independently controllable and laterally spaced temperature zones. An optical metrology system is arranged to view an interior volume of the chamber body through the transmissive region of the showerhead assembly. The substrate support assembly has a bias power source and at least two plasma power sources coupled thereto.

In another embodiment, a processing chamber includes a chamber body having a gas distribution plate and substrate support assembly disposed therein. The gas distribution plate has an outer set of gas flow holes, an inner set of gas flow holes, and a set of optical metrology holes. An inner gas flow zone is fluidly coupled to an interior volume of the chamber body through the first set of gas flow holes. An outer gas flow zone is fluidly isolated from the inner zone and coupled to the interior volume through the second set of gas flow holes. A ceramic plug having a plurality of holes is aligned with the optical metrology holes and a window. The substrate support assembly is disposed in the chamber body and has at least two independently controllable laterally spaced temperature zones. An optical metrology system is arranged to view the interior volume of the chamber body through an optical passage defined by the window, the holes in the plug and optical metrology holes. The substrate support assembly has a bias power source and at least two plasma power sources coupled thereto.

In another embodiment, a method for etching high aspect ratio features is provided that includes providing a plurality of gases to a mixing manifold, controlling a ratio of mixed gases flowing from the mixing manifold to different regions of a processing chamber; and providing at least one direct injection gas to at least one of the regions of the processing chamber bypassing the mixing manifold.

In yet another embodiment, a showerhead assembly is provided that includes a gas distribution plate coupled to an upper section. The gas distribution plate has an outer set of gas flow holes, and inner set of gas flow holes, and a set of optical metrology holes. The upper section has a first plenum fluidly coupled to the outer set of gas flow holes and a second plenum fluidly coupled to the inner set of gas flow holes. The plenums are fluidly isolated within the upper section. A ceramic plug is disposed through the upper section and has an optically transmissive region aligned with the optical metrology holes.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that elements of one embodiment may be advantageously utilized in other embodiments without further recitation.

DETAILED DESCRIPTION

Figure 1:
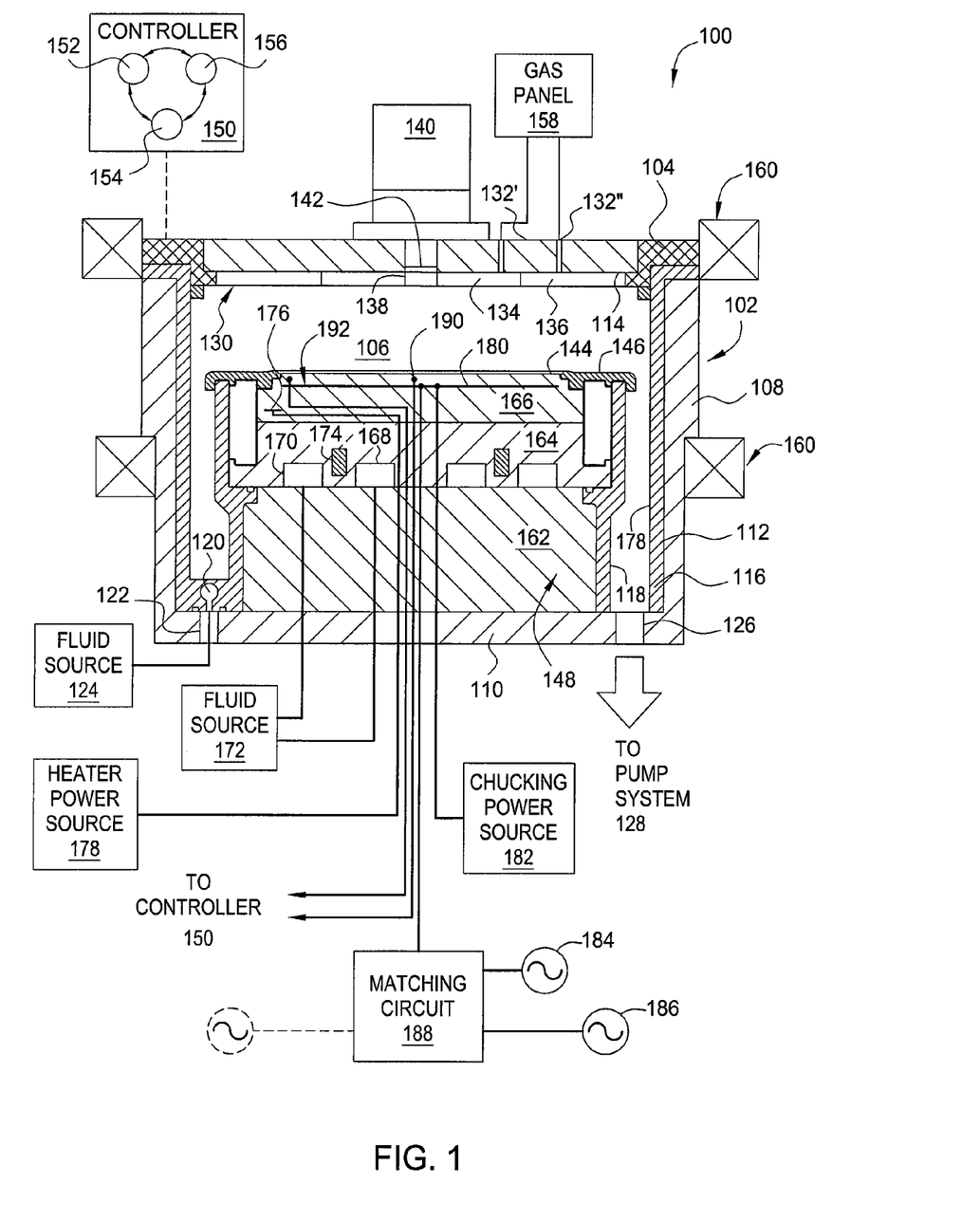
FIG. 1 is a sectional view of one embodiment of a processing chamber of the present invention.

FIG. 1 is a sectional view of one embodiment of a processing chamber 100 suitable for etching high aspect ratio features in a substrate 144. Although the processing chamber 100 is shown including a plurality of features that enable superior etching performance, it is contemplated that other processing chambers may be adapted to benefit from one or more of the inventive features disclosed herein.

The processing chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate access port (not shown) is generally defined in a side wall 108 and a selectively sealed by a slit valve to facilitate entry and egress of the substrate 144 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one embodiment, the pump system 128 maintains the pressure inside the interior volume 106 at operating pressures typically between about 10 mTorr to about 20 Torr.

The lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one embodiment, the window 142 is comprised of quartz or other suitable material that is transmissive to a signal utilized by an optical monitoring system 140.

The optical monitoring system 140 is positioned to view at least one of the interior volume 106 of the chamber body 102 and/or the substrate 144 positioned on a substrate support assembly 148 through the window 142. In one embodiment, the optical monitoring system 140 is coupled to the lid 104 and facilitates an integrated etch process that uses optical metrology to provide information that enables process adjustment to compensate for incoming pattern inconsistencies (such as CD, thickness, and the like), provide process state monitoring (such as plasma monitoring, temperature monitoring, and the like), and/or end point detection, among others. One optical monitoring system that may be adapted to benefit from the invention is the EyeD® full-spectrum, interferometric metrology module, available from Applied Materials, Inc., of Santa Clara, Calif.

In one embodiment, the optical monitoring system 140 is capable of measuring CDs, film thickness and plasma attributes. The optical monitoring system 140 may use one of more non-destructive optical measuring techniques, such as spectroscopy, interferometry, scatterometry, reflectometry, and the like. The optical monitoring system 140 may be, for example, configured to perform an interferometric monitoring technique (e.g., counting interference fringes in the time domain, measuring position of the fringes in the frequency domain, and the like) to measure the etch depth profile of the structure being formed on the substrate 144 in real time. Details of how to use examples of an optical monitoring have been disclosed in commonly assigned U.S. application Ser. No. 60/479,601, titled "Method and System for Monitoring an Etch Process", filed on Jun. 18, 2003, U.S. Pat. No. 6,413, 837, titled "Film Thickness Control Using Spectral Interferometry", issued on Jul. 2, 2002, and U.S. application Ser. No. 60/462,493, titled "Process Control Enhancement and Fault Detection Using In-Situ and Ex-situ Metrologies and Data Retrieval In Multiple Pass Wafer Processing", filed on Apr. 11, 2003, all of which are incorporated by reference in their entireties.

A gas panel 158 is coupled to the processing chamber 100 to provide process and/or cleaning gases to the interior volume 106. In the embodiment depicted in FIG. 1, inlet ports 132', 132" are provided in the lid 104 to allow gases to be delivered from the gas panel 158 to the interior volume 106 of the processing chamber 100.

A showerhead assembly 130 is coupled to an interior surface 114 of the lid 104. The showerhead assembly 130 includes a plurality of apertures that allow the gases flowing through the showerhead assembly 130 from the inlet port 132 into the interior volume 106 of the processing chamber 100 in a predefined distribution across the surface of the substrate 144 being processed in the chamber 100.

The showerhead assembly 130 additionally includes a region transmissive to an optical metrology signal. The optically transmissive region or passage 138 is suitable for allowing the optical monitoring system 140 to view the interior volume 106 and/or substrate 144 positioned on the substrate support assembly 148. The passage 138 may be a material, an aperture or plurality of apertures formed or disposed in the showerhead assembly 130 that is substantially transmissive to the wavelengths of energy generated by, and reflected back to, the optical measuring system 140. In one embodiment, the passage 138 includes a window 142 to prevent gas leakage that the passage 138. The window 142 may be a sapphire plate, quartz plate or other suitable material. The window 142 may alternatively be disposed in the lid 104.

In one embodiment, the showerhead assembly 130 is configured with a plurality of zones that allow for separate control of gas flowing into the interior volume 106 of the processing chamber 100. In the embodiment FIG. 1, the showerhead assembly 130 as an inner zone 134 and an outer zone 136 that are separately coupled to the gas panel 158 through separate inlets 132.

Figures 2, 3:
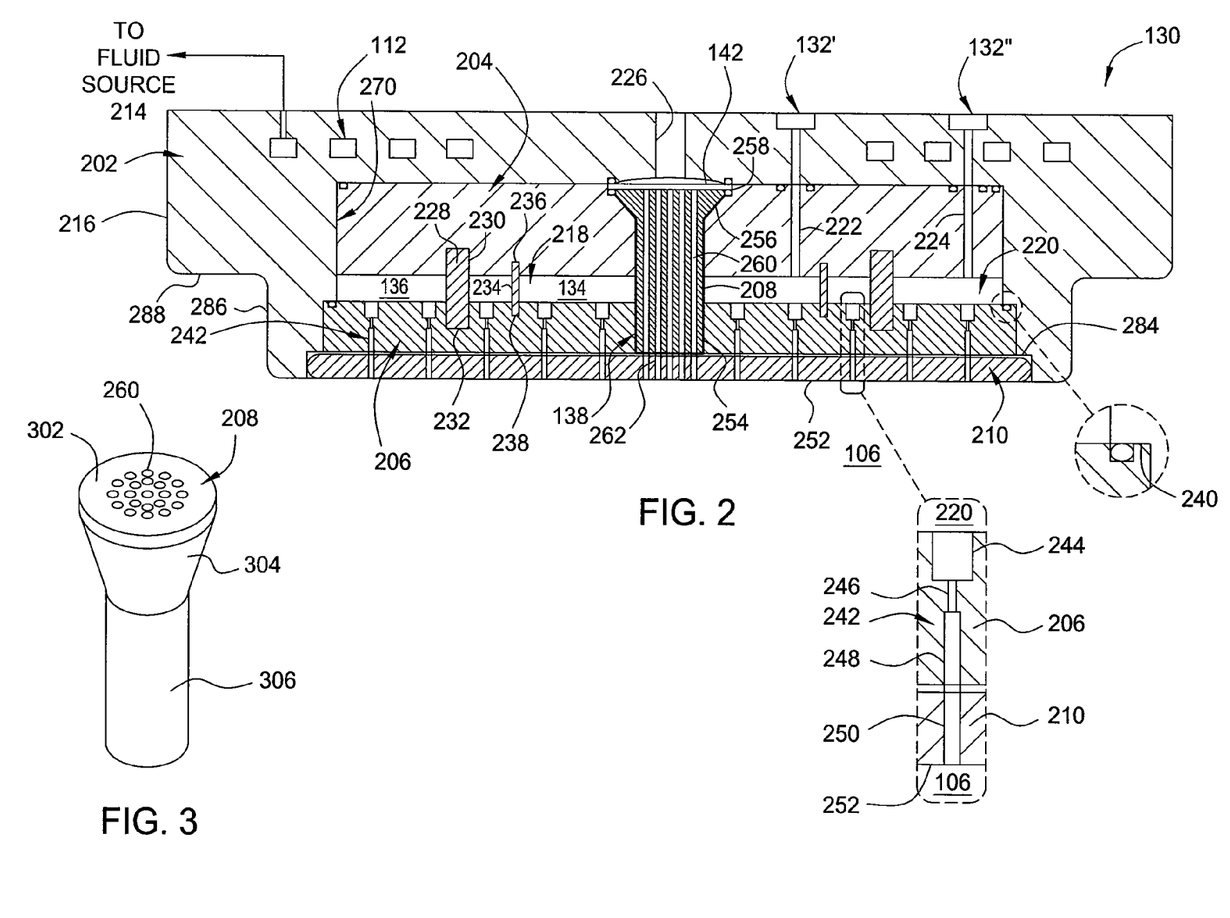
FIG. 2 is a sectional view of one embodiment of a showerhead.
FIG. 3 is a perspective view of one embodiment of a plug of the showerhead of FIG. 2

FIG. 2 is a sectional view of one embodiment of the showerhead assembly 130. The showerhead assembly 130 generally includes a base 202, upper and lower plenum plates 204, 206, a plug 208 and a gas distribution plate 210. The upper and lower plenum plates 204, 206 are coupled to each other in a spaced-apart relation and disposed in a recess 270 formed in the base 202 to define the upper structure of the showerhead assembly 130. The plenum region defined between the plates 204, 206 is fluidly separated into at least two zones by a barrier wall 236. In the embodiment depicted in FIG. 2, the wall 236 separates an inner plenum 218 from an outer plenum 220. The plenums 218, 220 are respectively fed by the inlet ports 132', 132" formed in the base 202 by gas feeds 222, 224 defined through the base 202 and upper plenum plate 204. Gas passages 242, discussed in detail below, are defined through the lower plenum plate 204 and gas distribution plate 210 allow gases in the plenums 218, 220 to enter the interior volume 106 of the chamber 100. The number and distribution of the passages 242 are selected to provide a predefined distribution of gases into the chamber 100.

The recess 270 formed in the base 202 may include one or more steps for locating the plates 204, 206. In the embodiment depicted in FIG. 2, the recess 270 includes an inner step 240 and an outer step 284. The inner step 240 provides a surface against which the lower plenum plate 206 is disposed. A seal, un-numbered, is provided between the inner step 240 and the lower plenum plate 206 to prevent gas leakage. The outer step 284 provides a recess into the base 202 which allows the gas distribution plate 210 to cover the gap defined between the lower plenum plate 206 and base 202.

The base 202 generally includes a lip 216 extending outward from an inner outer diameter 286. A ledge 288, defined between the lip 216 and the inner outer diameter 286, supports the showerhead assembly 130 on the lid 104 and/or outer liner 116. The ledge 288 is generally perpendicular to the lip 216 and the inner outer diameter 286, which are generally parallel and concentric to a centerline of the chamber body.

The inner outer diameter 286 ends at a bottom surface 290 of the base 202. The bottom surface 290 generally faces the processing area, and as such, may be coated with a protective material, such as $Y_2O_3$.

The base 202 also includes a plurality of channels 212 formed therein that are coupled to a fluid source 214. The fluid source 214 provides a heat transfer fluid, such as air or water, which is circulated through the channels 212 to regulate the temperature of the base 202 and showerhead assembly 130.

The passage 138 is formed through the showerhead assembly 130 to facilitate monitoring of chamber processes and/or substrate attributes by the optical monitoring system 140. The passage 138 includes coaxially aligned apertures 226, 264, 254, 262. The first aperture 226 is formed in the base 202. The second aperture 264 is formed in the upper plenum plate 204. The third aperture 254 is formed in the lower plenum plate 206, while the aperture 262 is formed in the gas distribution plate 210. The window 142 is sealingly disposed in the passage 138 to prevent gas leakage through the showerhead assembly 130 to the optical monitoring system 140. In the embodiment depicted in FIG. 2, a recess 258 is provided in the upper plenum plate 204 to house the window 142. O-rings, not labeled with reference numerals in FIG. 2, are provided to seal the window 142 to the upper plenum plate 204 and the base 202.

The plug 208 is disposed at least in the second aperture 264 formed in the upper plenum plate 204. The plug 208 is configured to be transmissive to the signal utilized by the optical monitoring system 140. In one embodiment, the plug 208 includes a plurality of high aspect ratio passages 260 which allow the optical monitoring system 140 to interface with the interior volume of the chamber 100 while preventing plasma formation within the passages 260. In one embodiment, the passages 260 have an aspect ratio (height to diameter) of at least about 10:1, for example 14:1. In another embodiment, passages 260 have a diameter of less than or comparable to the DEBYE length and/or the electron mean free path, for example less than about 1.5 mm, for example, about 0.9 mm. In another embodiment, passages 260 define an open area of up to about 60 percent open area. In yet another embodiment, about 37 of passages 260 are formed through the plug 208.

The passages 260 formed in the plug 208 are aligned with metrology apertures 262 formed in the gas distribution plate 210. The metrology apertures 262 are clustered at the center of the gas distribution plate 210, and have a density, diameter (or width), profile, and open area suitable for facilitating the effective transmission of the metrology signal through the gas distribution plate 210. In one embodiment, the number and sectional profile of the apertures 262 are similar to that of the passages 260. The window 142 makes the passages 260, 262 blind in a gas flow sense, while allowing optical transmission. Thus, the passages 260, 262 and window 142 facilitate optical monitoring by the optical monitoring system 140 within the chamber 100 without vacuum loss or plasma damage to the structure defining the optical view path.

A tapered seat 256 is formed in the upper plenum plate 204 coupling the second aperture 264 to the recess 258. The tapered seat 256 is configured to mate with a flared section 304 of the plug 208, as shown in FIG. 3. The flared section 304 is positioned between a head 302 and elongated stem 306 of the plug 208.

The plug 208 is generally fabricated from a material compatible with process chemistries. In one embodiment, the plug 208 is fabricated from a dielectric material, such as a ceramic. In another embodiment, the plug 208 is aluminum.

Figure 4:
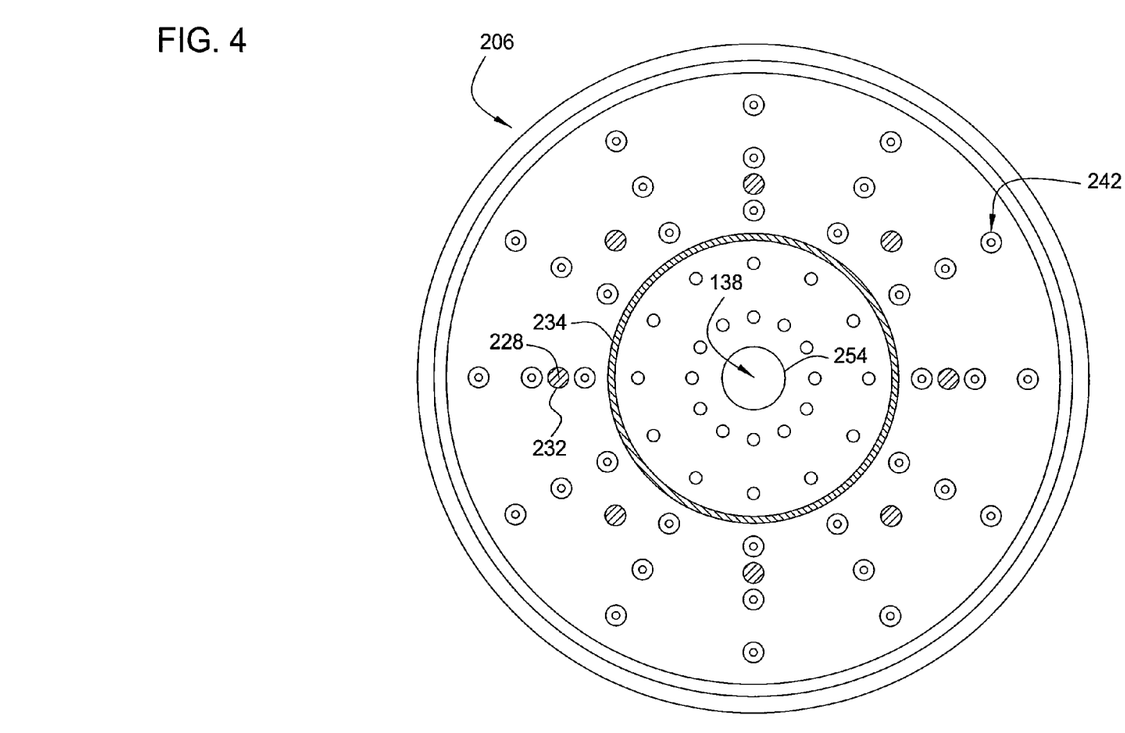
FIG. 4 is a sectional view of the showerhead of FIG. 2.

The upper and lower plenum plates 204, 206 are coupled to the base 202. The upper plenum plate 204 is also coupled to the lower plenum plate 206. In one embodiment, upper plenum plate 204 is coupled to the lower plenum plate 206 by a plurality of pins 228. The ends of the pins 228 are inserted into holes 230, 232 respectively formed in the upper and lower plenum plates 204, 206. The pins 228 may be secured by a locking compound or adhesive, or may be pressed for friction fit. The sectional view of FIG. 4 illustrates the pins 228 extending from holes 232 formed in the lower plenum plate 206. As the holes 230, 232 do not extend through the respective plates 204, 206, gas leakage around the pins 228 is prevented.

Figure 5:
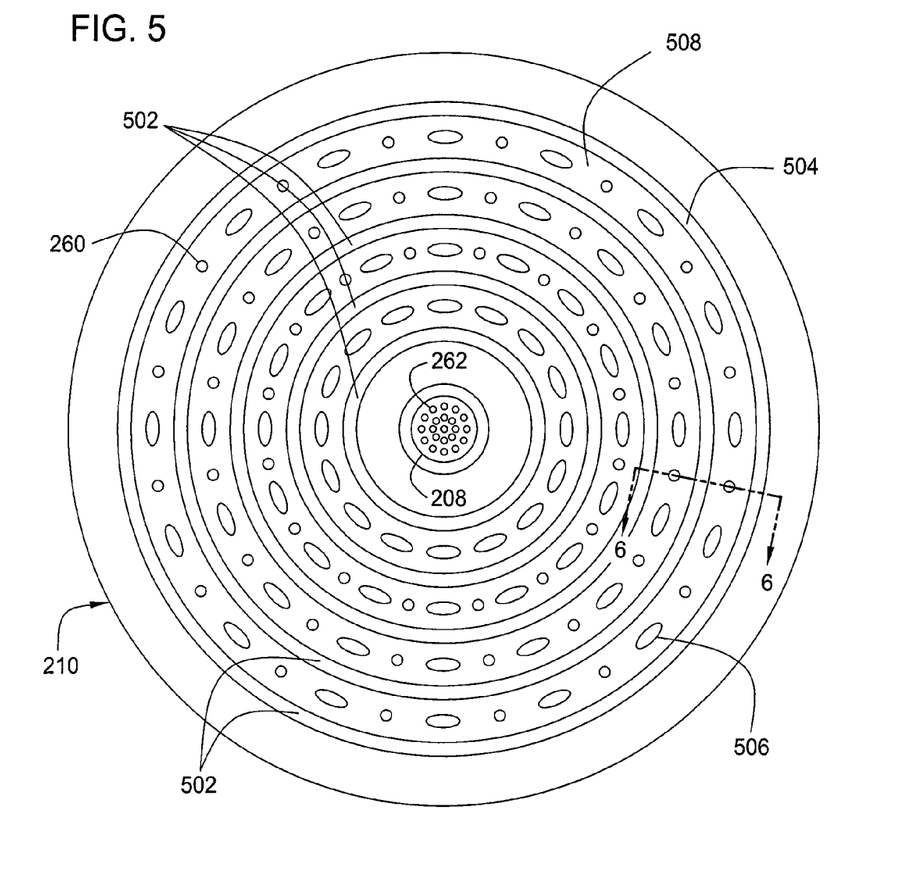
FIG. 5 is another sectional view of the showerhead of FIG. 2.
Figure 6:
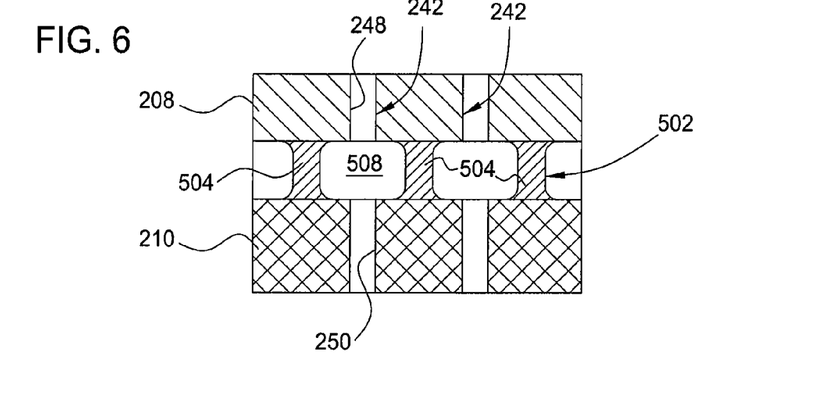
FIG. 6 is a partial sectional view of the showerhead taken along section lines 6-6 of FIG. 5.

Referring additionally to the sectional views of FIGS. 5-6, the gas distribution plate 210 is coupled to at least one of the lower plenum plate 206 or base 202. In one embodiment, an adhesive layer 502 couples the gas distribution plate 210 to the lower plenum plate 206 in a manner that defines a plurality of annular plenums 508 therebetween. The plenums 508 allow passages 242 positioned along common radii or range of radius to be fluidly coupled to enhance flow uniformity of gases passing through the showerhead assembly 130 at a predefined radial position.

In one embodiment, the adhesive layer 502 includes a plurality of adhesive rings 504 and a plurality of adhesive beads 506. The plurality of adhesive rings 504 are arranged concentrically to bound the plenums 508. The plurality of adhesive beads 506 are also arranged concentrically between the rings 504. The beads 506 are spaced from the rings 504 to allow gases to flow around the beads 506 between passages 242 sharing a common plenum 508.

Returning to FIG. 2, the portion of the passages 242 formed in the lower plenum plate 206 generally includes a first bore hole 244, an orifice hole 246 and a second bore hole 248. The first bore hole 244 is open to the plenum 220 (or 218) to allow gases to enter the passage 242. The second bore hole 248 is aligned with the hole 250 formed through the gas distribution plate 210 for delivering gas into the interior volume 106 of the chamber 100.

In one embodiment, the bore holes 244, 248 are substantially greater in both diameter and depth relative to the orifice hole 246 to facilitate efficient fabrication of the passage 242. In the embodiment depicted in FIG. 2, the first bore hole 244 is open to the plenum 220 (or 218) has a greater diameter and lower aspect ratio than the second bore hole 248 which is open to the interior volume 106 of the chamber 100.

The gas distribution plate 210 may be a flat disc. The holes 250 are spatially distributed in a pattern outward of the center region of the gas distribution plate 210. One set of holes 250 are fluidly coupled to the outer plenum 136, while a second set of holes 250 are fluidly coupled to the inner plenum 134. The holes 250, as being part of the passages 242, allow gas passage through the gas distribution plate 210 and into the interior volume 106 of the chamber 100.

To extend the service life of the showerhead assembly 130, the gas distribution plate 210 is at least one of fabricated or coated with Yttrium or an oxide thereof. In one embodiment, the gas distribution plate 210 is fabricated from bulk Yttrium or oxide thereof to provide resistance to fluorinated chemistries. In other embodiment, the gas distribution plate 210 is fabricated from bulk $Y_2O_3$.

Figure 7:
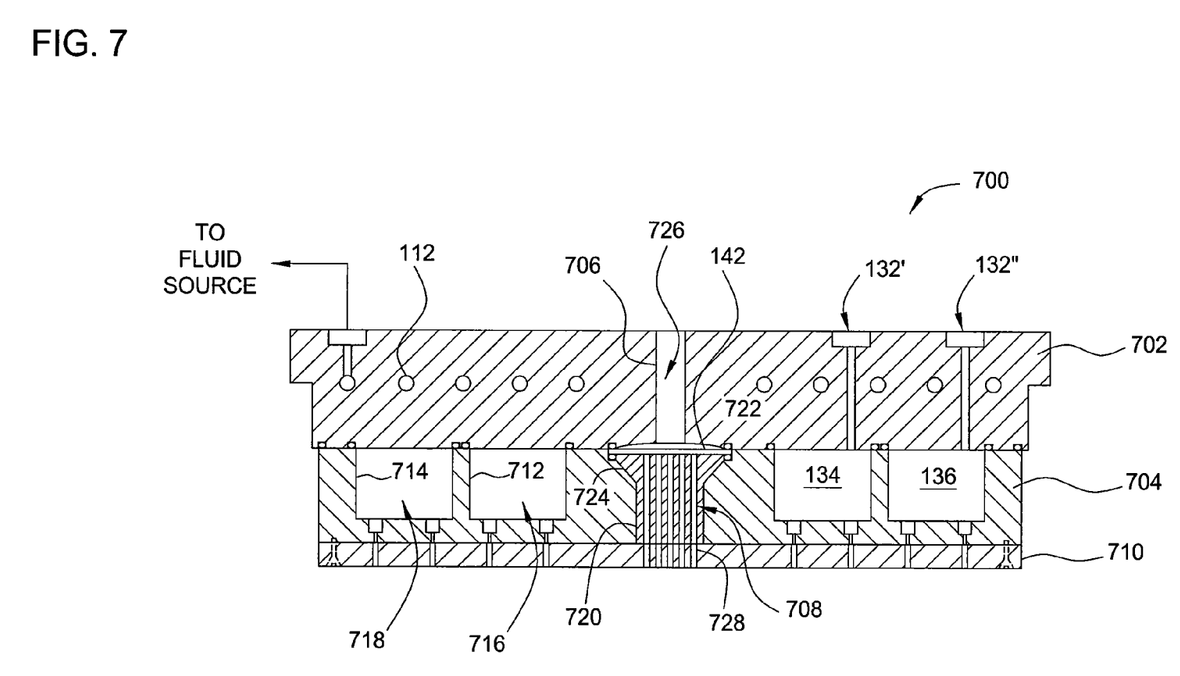
FIG. 7 is a sectional view of another embodiment of a showerhead.

FIG. 7 is another embodiment of a showerhead assembly 700. The showerhead assembly 700 is substantially similar to the showerhead assembly 138, having a plug 708 for preventing plasma light-up in a passage 726 formed through the showerhead assembly 700 to facilitate optical metrology. A window 142 is provided in the passage 726 as a gas barrier.

The showerhead assembly 700 includes a base plate 702 coupled to a plenum plate 704. The plenum plate 704 has a pair of annular grooves 712, 714 formed therein that are bounded by the base plate 702 for defining inner and outer plenums 716, 718. Gases are provided to the plenums 716, 718 through respective ports 132', 132" from the gas panel 158, thereby allowing the gases to be individually controlled in each zone 134, 136 extending into the interior volume 106 of the chamber 100 from the showerhead assembly 700.

The plenum plate 704 includes a plug hole 720 for receiving the plug 708. The plug hole 720 aligns with an aperture 706 formed in the base 702 and metrology holes 728 formed in the gas distribution plate 710 to define the passage 726. The plug hole 720 generally includes a recess 722 for receiving the window 142 and a tapered seat 724. The tapered seat 724 engages the flared region of the plug 708 to locate the plug 708 within the plenum plate 704.

Figure 8:
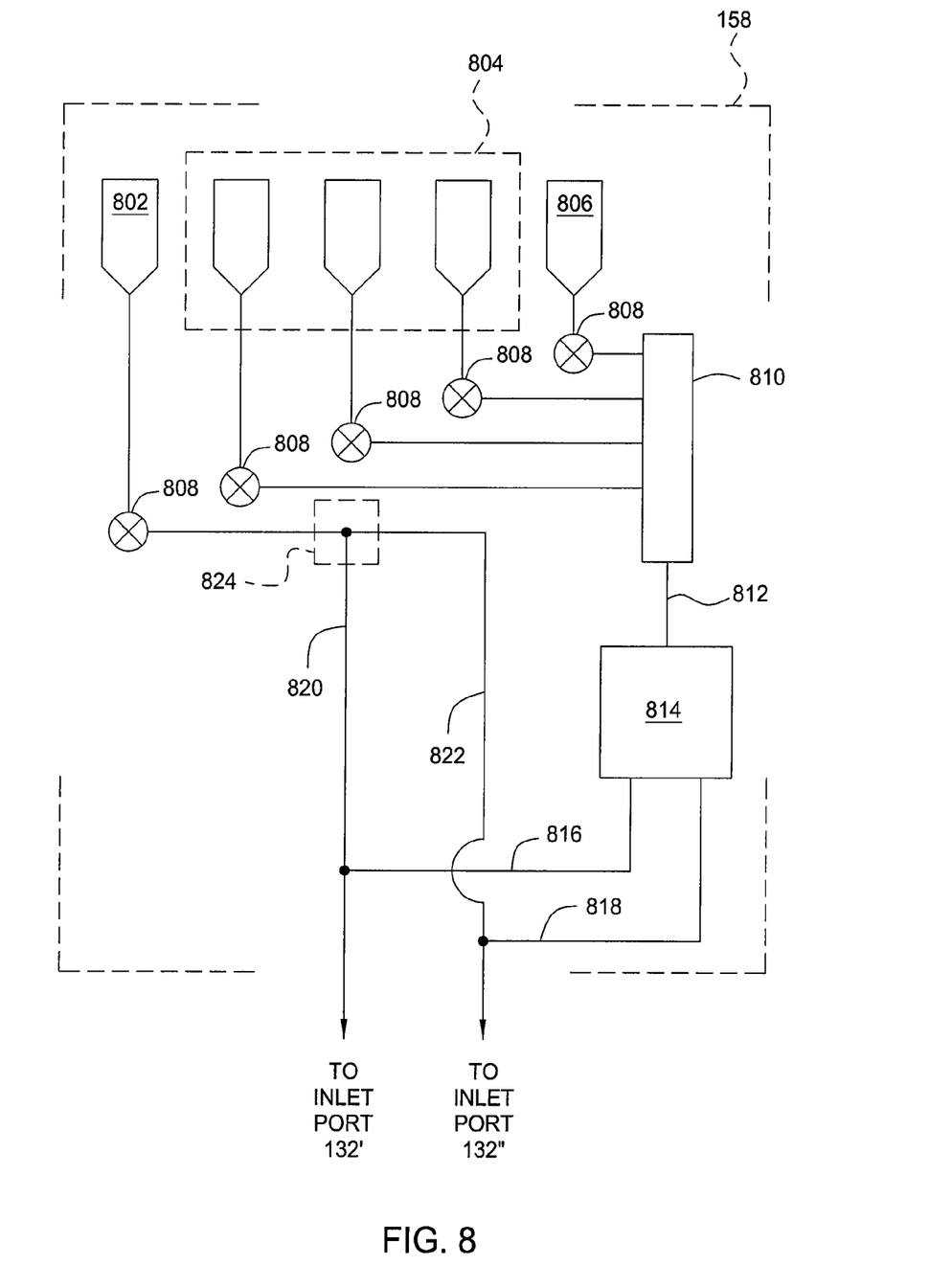
FIG. 8 is one embodiment of a gas control a schematic diagram illustrating the routing and control of gases for the processing chamber of FIG. 1.

FIG. 8 is one embodiment of a schematic diagram illustrating the routing and control of gases delivered from the gas panel 158 to the processing chamber 100. The gas panel 158 generally includes a plurality of gas sources coupled to a mixing manifold 810 and a flow controller 814.

Generally, flow from each of the gas sources is controlled by a control valve 808. The control valve 808 controls at least one of the flow, rate, pressure, and the like of the fluids provided from the sources. The control valve 808 may include more than one valve, regulator and/or other flow control device.

In the one embodiment, the gas panel 158 includes at least one direct gas source 802, at least one processing gas source 804 and at least one carrier gas source 806. The processing gas sources 804 and the carrier gas source 806 are fluidly coupled to the mixing manifold 810 by individual gas lines. The various gases from the sources 804, 806 are combined in the mixing manifold 810 into pre-delivery gas mixture. As such, the composition of the pre-delivery gas mixture in the mixing manifold 810 may be chosen by selectively opening the respective valves 808 so that a predetermined combination of carrier and process gases 806, 804 are combined. For example, at least one processing gas from the processing gas source 804, and optionally at least one carrier gas from the carrier gas source 806 may be combined in the mixing manifold 810 in any combination. Examples of processing gases include $SiCl_4$, HBr, $NF_3$, $O_2$ and $SiF_4$, among others. Examples of carrier gases include N2, He, Ar, other gases inert to the process and non-reactive gases.

The flow controller 814 is coupled to the mixing manifold 810 by a primary gas feed 812. The flow controller 814 is configured to split the pre-delivery gas mixture flowing from the mixing manifold 810 into sub-mixtures delivered to the chamber 100 through separate gas feed lines. Generally, the number of gas feed lines is commensurate with the number of zones (or isolated plenums) defined in the showerhead assembly 130. In the embodiment depicted in FIG. 8, two gas feed lines 816, 818 couple the flow controller 814 to the respective inlet ports 132', 132".

The flow controller 814 is generally configured to control the ratio of sub-mixtures flowing in each feed line 816, 818. In this manner, the ratio of gas sub-mixtures flowing to each zone, and ultimately to each region of the substrate 144, may be controlled. The flow controller 814 may split the pre-delivery gas mixture using electronic or mechanical devices. In one embodiment, the flow controller 814 is able to dynamically control the ratio in response to a signal from the controller 150, thereby enabling the ratio to be changed between batches of substrates, between substrates, and/or in-situ processing a single substrate. In another embodiment, the flow controller 814 is set such that the ratio is fixed between the lines 816, 818. The ratio may be set by one or more orifices disposed in the flow controller 814 such that the flow from the primary gas feed 812 is preferentially split between the gas feed lines 816, 818.

In one embodiment, the flow controller 814 provides more gas to the inner zone 134 than the outer zone 136. In still another embodiment, the flow controller 814 provides more gas to the outer zone 136 than the inner zone 134. In still another embodiment, the flow controller 814 provides more gas to the inner zone 134 than the outer zone 136 for a first period of substrate processing, then changes the ratio in-situ processing the substrate to provide more gas to the outer zone 136 than the inner zone 134 for a second period of substrate processing. It is contemplated that the flow controller 814 may be configured to control the ratio between flows delivered to different zones in the process chamber 100 in other sequences or ratios.

A directly injected gas is also provided to the interior volume 106 of the processing chamber 100 from the direct injection gas source 802 of the gas panel 158. The amount of directly injected gas flowing from the direct injection gas source 802 is controlled by a valve 808.

In one embodiment, the directly injected gas is provided to at least one of the gas feeds 816, 818. In another embodiment, the directly injected gas is teed into two direct feed lines 820, 822 that are respectively teed into the gas feed lines 816, 818. In yet another embodiment, the directly injected gas is provided to at least one of the gas feeds coupled to the inlet ports 132', 132". In still another embodiment, the directly injected gas is provided to at least one of the plenums 218, 220 (716, 718) of the showerhead assembly 130 (700).

In the embodiment depicted in FIG. 8, the same amount of directly injected gas is provided to each zone 134, 136. Optionally, a second flow controller 824 (shown in phantom, and similar to the flow controller 814) may be utilized to provide different ratios of directly injected gas to each of the zones 134, 136.

Returning to FIG. 1, a substrate support assembly 148 is disposed in the interior volume 106 of the processing chamber 100 below the showerhead assembly 130. The substrate support assembly 148 holds the substrate 144 during processing. The substrate support assembly 148 generally includes a plurality of lift pins (not shown) disposed therethrough that are configured to lift the substrate from the support assembly 148 and facilitate exchange of the substrate 144 with a robot (not shown) in a conventional manner.

In one embodiment, the substrate support assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among other, to the base 164 and chuck 166.

At least one of the base 164 or chuck 166 may include at least one optional embedded heater 176, at least one optional embedded isolator 174 and a plurality of conduits to control the lateral temperature profile of the support assembly 148. In the embodiment depicted in FIG. 1, one annular isolator 174 and two conduits 168, 170 are disposed in the base 164, while a resistive heater 176 is disposed in the chuck 166. The conduits are fluidly coupled to a fluid source 172 that circulates a temperature regulating fluid therethrough. The heater 176 is regulated by a power source 178. The conduits 168, 170 and heater 176 are utilized to control the temperature of the base 164, thereby heating and/or cooling the electrostatic chuck 166, thereby controlling, at least in part, the temperature of the substrate 144 disposed on the electrostatic chuck 166.

The two separate cooling passages 168, 170 formed in the base 164 define at least two independently controllable temperature zones. It is contemplated that additional cooling passages and/or the layout of the passages may be arranged to define additional temperature control zones. In one embodiment, the first cooling passage 168 is arranged radially inward of the second cooling passage 170 such that the temperature control zones are concentric. It is contemplated that the passages 168, 170 may radially orientated, or have other geometric configurations. The cooling passages 168, 170 may be coupled to a single source 172 of a temperature controlled heat transfer fluid, or may be respectively coupled to a separate heat transfer fluid source.

The isolator 174 is formed from a material having a different coefficient of thermal conductivity than the material of the adjacent regions of the base 164. In one embodiment, the isolator 174 has a smaller coefficient of thermal conductivity than the base 164. In a further embodiment, the isolator 174 may be formed from a material having an anisotropic (i.e. direction-dependent) coefficient of thermal conductivity. The isolator 174 functions to locally change the rate of heat transfer between the support assembly 148 through the base 164 to the conduits 168, 170 relative to the rate of heat transfer though neighboring portions of the base 164 not having an isolator in the heat transfer path. An isolator 174 is laterally disposed between the first and second cooling passages 168, 170 to provide enhanced thermal isolation between the temperature control zones defined through the substrate support assembly 148.

In the embodiment depicted in FIG. 1, the isolator 174 is disposed between the conduits 168, 170, thereby hindering lateral heat transfer and promoting lateral temperature control zones across the substrate support assembly 148. Thus, by controlling the number, shape, size, position and coefficient of heat transfer of the inserts, the temperature profile of the electrostatic chuck 166, and the substrate 144 seated thereon, may be controlled. Although the isolator 174 is depicted in FIG. 1 shaped as an annular ring, the shape of the isolator 174 may take any number of forms.

An optional thermally conductive paste or adhesive (not shown) may be disposed on between the base 164 and the electrostatic chuck 166. The conductive paste facilitates heat exchange between the electrostatic chuck 166 and the base 164. In one exemplary embodiment, the adhesive mechanically bonds the electrostatic chuck 166 to base 164. Alternatively (not shown), the substrate support assembly 148 may include a hardware (e.g., clamps, screws, and the like) adapted for fastening the electrostatic chuck 166 to the base 164.

The temperature of the electrostatic chuck 166 and the base 164 is monitored using a plurality of sensors. In the embodiment depicted in FIG. 1, a first temperature sensor 190 and a second temperature sensor 192 are shown in a radially spaced orientation such that the first temperature sensor 190 may provide the controller 150 with a metric indicative of the temperature of a center region of the support assembly 148 while the second temperature sensor 192 provide the controller 150 with a metric indicative of the temperature of a perimeter region of the support assembly 148.

The electrostatic chuck 166 is disposed on the base 164 and is circumscribed by a focus ring 146. The electrostatic chuck 166 may be fabricated from aluminum, ceramic or other materials suitable for supporting the substrate 144 during processing. In one embodiment, the electrostatic chuck 166 is ceramic. Alternatively, the electrostatic chuck 166 may be replaced by a vacuum chuck, mechanical chuck, or other suitable substrate support.

The electrostatic chuck 166 is generally formed from ceramic or similar dielectric material and comprises at least one clamping electrode 180 controlled using a chucking power source 182. The electrode 180 (or other electrode disposed in the chuck 166 or base 164) may further be coupled to one or more RF power sources for maintaining a plasma formed form process and/or other gases within the processing chamber 100.

In the embodiment depicted in FIG. 1, the electrode 180 is coupled, through a matching circuit 188, to a first RF power source 184 and a second RF power source 186. The sources 184, 186 are generally capable of producing an RF signal having a frequency from about 50 kHz to about 3 GHz and a power of up to about 10,000 Watts. The matching network 188 matches the impedance of the sources 184, 186 to the plasma impedance. A single feed couples energy from both sources 184, 186 to the electrode 180. Alternatively, each source 184, 186 can be coupled to the electrode 180 via a separate feed.

The electrostatic chuck 166 may also include at least one embedded heater 176 controlled by a power supply 178. The electrostatic chuck 166 may further comprise a plurality of gas passages (not shown), such as grooves, that are formed in a substrate supporting surface of the chuck and fluidly coupled to a source of a heat transfer (or backside) gas. In operation, the backside gas (e.g., helium (He)) is provided at controlled pressure into the gas passages to enhance the heat transfer between the electrostatic chuck 166 and the substrate 144. Conventionally, at least the substrate supporting surface 176 of the electrostatic chuck is provided with a coating resistant to the chemistries and temperatures used during processing the substrates.

Figure 9:
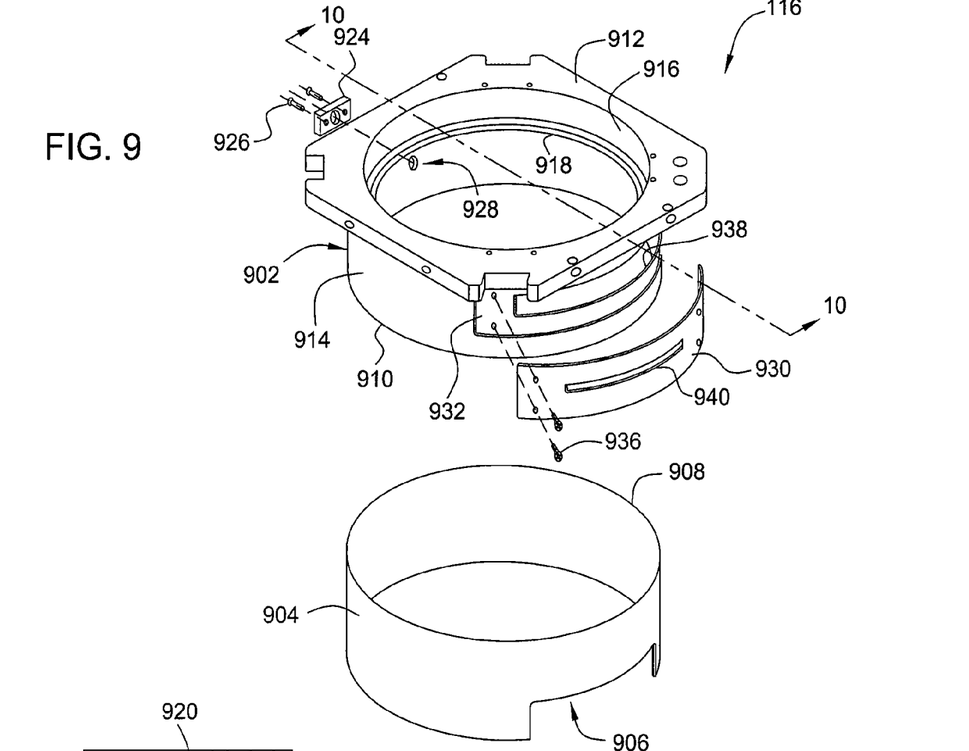
FIGS. 9-10 are perspective and partial sectional views of one embodiment of a liner.
Figure 10:
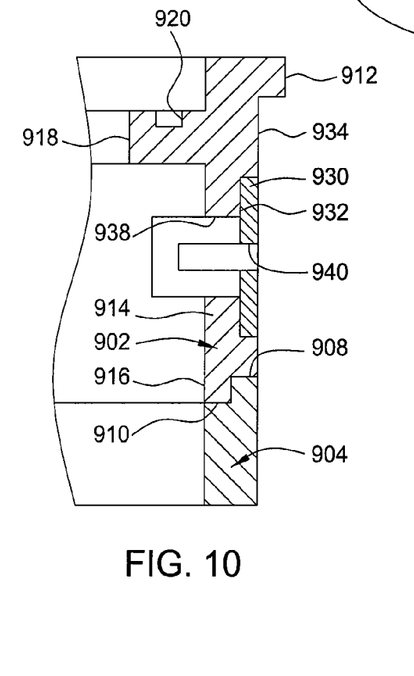

FIGS. 9-10 depict an exploded perspective view and a partial sectional view of one embodiment of the outer liner 116. The outer liner 116 may be fabricated and/or coated with a plasma or fluorine resistant material. In one embodiment, the outer liner 116 is fabricated from or coated with Yttrium, Yttrium alloy or an oxide thereof. In other embodiment, the outer liner 116 is fabricated from bulk $Y_2O_3$.

In the embodiment depicted in FIGS. 9-10, the outer liner 116 includes an upper liner 902 and a lower liner 904. An upper edge 908 of the lower liner 904 is configured to mate with a lower edge 910 of the upper liner 902, for example, in a rabbit joint.

The lower liner 904 is generally a hollow cylinder configured to fit snugly against an interior surface 112 of the sidewalls 108. The lower liner 904 includes a notch or port 906 that aligns with the exhaust port 126 of the chamber body 102 to facilitate pump down and exhausting the interior volume 106.

The upper liner 902 generally includes a body 914 having a flange 912 extending from an upper portion thereof. The body 914 is generally cylindrical in form, having an inner wall 916 and an outer all 934. A lip 918 extends inward from the inner wall 916 and provides a supporting land for the showerhead assembly 130 once installed in the chamber 100. An o-ring groove 920 is formed in the lip 918 to provide a gas seal with the showerhead assembly 130.

An aperture 928 may be provided in the body 914 of the upper liner 902 to allow visual inspection of the interior volume 106 through a window (not shown) formed in the chamber body 102. The portion of outer wall 934 of the upper liner 902 surrounding the aperture 928 may be covered by a removable window insert 924. The window insert 924 secured in a depression (not shown) in the upper liner 902 by a plurality of fasteners 926 such that the insert 924 and outer wall 934 are flush. Thus, as the protect coating of the window insert 924 is worn from contact with the window/chamber body interface, the window insert 924 may be replaced before the protective coating is broken through, exposing the base material of the outer liner 116.

A slot 938 is formed in the cylinder 914 to allow passage of the substrate into and out of the chamber 100. A recess 932 is formed in the outer wall 934 of the upper liner 902 surrounding the slot 938. A removable door insert 930 is disposed over the slot 938 to protect the surface of the liner 902 from wear caused by contact with the slit valve port. The insert 930 has a slot 940 that aligns with the slot 938 formed in the upper liner 902 to facilitate substrate passage through the outer liner 116. The insert 930 is secured in the recess 932 by a plurality of fasteners 936 such that the insert 930 and outer wall 934 are flush. Thus, as the protect coating of the insert 930 is worn from contact with the slit valve port/chamber body interface, the insert 930 may be replaced before the protective coating is broken through, exposing the base material of the outer liner 116. The inserts 924, 930 are generally fabricated from and/or coated with the same material as the liners.

Figure 11:
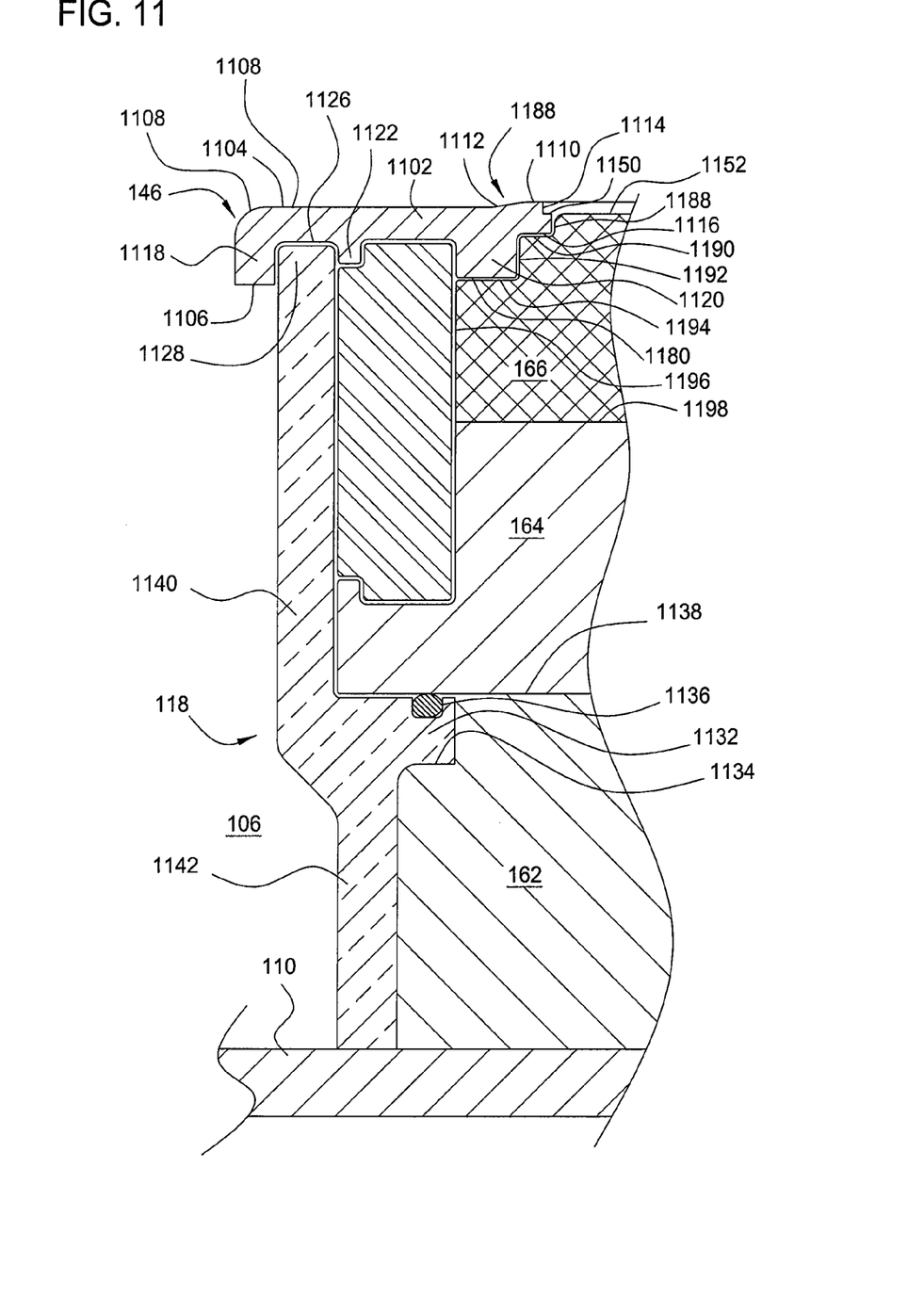
FIG. 11 is a partial sectional view of a substrate support assembly supporting one embodiment of a cover ring.

FIG. 11 depicts on embodiment of inner liner 118 engaged with the focus ring 146 that covers the outer upper surface of the substrate support assembly 148. The inner liner 118 generally includes a larger diameter upper section 1140 and a smaller diameter lower section 1142. A flange 1132 extends inward from the junction of the sections 1140, 1142.

The flange 1132 has a bottom surface 1134 that locates the inner liner 118 with the substrate support assembly 148. An o-ring groove 1136 is formed in an upper surface of the flange 1132 to seal the inner liner 118.

The cover ring 146 is disposed on the substrate support assembly 148 and is interleaved with an upper end 1128 of the inner liner 118. The cover ring 146 generally has an annular body 1102 formed and/or coated with an plasma and/or chemistry resistant material. In one embodiment, the cover ring 146 is fabricated from and/or coated with Yttrium or an oxide thereof. In one embodiment, the gas cover ring 146 is fabricated from bulk Yttrium to provide resistance to fluorinated chemistries.

The body 1102 generally has a top surface 1104 and a bottom surface 1126. A first ridge 1118, a second ridge 1122 and a third ridge 1120 extending downward from the bottom surface 1126 of the body 1102. In the embodiment depicted in FIG. 11, the ridges 1118, 1122, 1120 are concentric rings.

The first and second ridges 1118, 1122 are disposed on the inner portion of the cover ring 146, and define a slot therebetween that captures the upper end 1128 of the inner liner 118 therein. The first ridge 1118 extends further from the body 1102 than the second ridge 1122. The third ridge 1120 also extends further from the body 1102 than the second ridge 1122. The third ridge 1120 extends into a slot 1180 formed in the substrate support assembly 148, thereby fixing the orientation between the cover ring 146 and support assembly 148.

A tab 1116 extends radially inward from the body 1102 proximate the third ridge 1120. The tab 1116 includes an upper surface 1150 that is substantially coplanar with an upper surface 1152 of the electrostatic chuck 166. The perimeter of the substrate (not shown in FIG. 11) covers the interface between the electrostatic chuck 166 and the upper surface 1150 of the tab 1116 when the substrate is disposed on the substrate support assembly 148.

An inner wall 1114 is disposed between the tab 1116 and the top surface 1104 of the body 1102. The inner wall 1114 has a diameter greater than an inside diameter of the tab 1116. Typically, the diameter of the inner wall 1114 is selected to provide adequate clearance with the substrate.

The top surface 1104 of the body 1102 generally includes an inner region 1110 and an outer region 1108. The inner region 1110 is raised relative to the outer region 1108. The inner region 1110 may be orientated parallel to the outer region 1108 of the top surface 1104. In the embodiment depicted in FIG. 11, a sloped region 1112 defines the transition between the inner and outer regions 1110, 1108 of the top surface 1104.

FIG. 11 also includes details of one embodiment of the electrostatic chuck 166. The electrostatic chuck 166 includes a stepped outer diameter surface defined between the upper surface 1152 and a lower surface 1198 of the chuck. The stepped outer diameter generally includes of an upper wall 1188, a middle wall 1192 and a lower wall 1196. The walls 1188, 1192, 1196 are generally vertical, with the upper wall 1188 being shorter than the middle wall 1192. The middle wall 1192 is shorter than the lower wall 1196. The upper wall 1188 begins at the upper surface 1152 and extends downward to an upper ledge 1190. The upper ledge 1190 couples the upper wall 1188 to the middle wall 1192. A lower ledge 1194 couples the middle wall 1192 and the lower wall 1196. The lower wall 1196 is coupled to the bottom surface 1198. The ledges 1190, 1194 are generally horizontal, with the lower ledge 1194 being larger than the upper ledge 1190. The stepped outer diameter created by the walls 1188, 1192, 1196 and ledges 1190, 1192 create a contoured profile that mates with and retains the focus ring 146 in a predetermined position on the substrate support assembly 148.

In operation, the processing chamber 100 may be utilized to etch a high aspect ratio feature in a substrate. In one embodiment, a method for etching a high aspect ratio trench in a silicon layer disposed on a substrate may be performed in the chamber 100. The silicon layer is covered with a patterned mask, as is conventionally practiced. The method begins by regulating the chamber pressure between about 0 to about 300 milliTorr (mT). The substrate is biased with about 500 to about 2800 Watts (W) of bias power. In one embodiment, the bias power is applied at a frequency of about 2 MegaHertz (MHz).

A plasma, formed from the gases provided through the multiple gas flow zones of the showerhead assembly, is maintained by the application of about 500 to about 2800 W to the substrate support assembly. In one embodiment, the power is applied at 60 MHz. A magnetic B-field is applied across the chamber having between about 0 about 140 Gauss (G). The silicone layer is plasma etched through the openings in the mask to form a trench having an aspect ratio up to at least 80:1.

A mixture of process, direct injection and inert gases are provided to the chamber for plasma etching. The mixture may include at least one of HBr, $NF_3$, $O_2$, $SiF_4$, $SiCl_4$ and Ar. In one embodiment, the process gases provided to the mixing manifold include HBr and $NF_3$, while $O_2$, $SiF_4$ and $SiCl_4$ may optionally be provided. In an exemplary embodiment, between about 50 to about 500 sccm of HBr, between about 10 to about 200 sccm of $NF_3$, between about 0 to about 200 sccm of $O_2$, between about 0 to about 200 sccm of $SiF_4$, between about 0 to about 200 sccm of $SiCl_4$, and between about 0 to about 200 sccm of Ar are provided to the mixing manifold for a process suitable for etching a 300 mm substrate. The mixed gases are provided to the plenums at a flow ratio selected commensurate with the feature density, size and lateral location. $SiCl_4$ may be used as a direct injection gas provided to the plenums of the showerhead assembly bypassing the mixing manifold.

It has been demonstrated that the processing chamber described above etches high aspect ratio features chamber with good uniformity across the surface of the substrate. Comparison data between etch silicon processes performed in convention processing chambers and the processing chamber described above illustrates an improvement of edge to center aspect ratio uniformity. Conventional systems may have an edge to center aspect ratio of about 1.35, while the processing chamber described above has an edge to center aspect ratio of about 1.04, making the inventive chamber suitable for fabrication of next generation devices.

While the foregoing is directed to embodiments of the present invention, other and further embodiments of the invention may be devised without departing from the basic scope thereof, and the scope thereof is determined by the claims that follow.

What is claimed is:

1. A processing chamber comprising:
   a chamber body assembly having an interior volume;
   a showerhead assembly coupled to a ceiling of the chamber body and having at least two fluidly isolated plenums formed therein, a region transmissive to an optical metrology signal defined through a ceramic plug, a first plurality of gas passages formed through the showerhead assembly fluidly coupling a first plenum of the at least two fluidly isolated plenums to the interior volume of the chamber body, wherein the first gas passages are distributed at a plurality radial distances from a center of the showerhead assembly, and a second plurality of gas passages formed through the showerhead assembly fluidly coupling a second plenum of the at least two fluidly isolated plenums to the interior volume of the chamber body, wherein the second gas passages are distributed at a plurality radial distances from the center of the showerhead assembly, wherein the showerhead assembly further includes a gas distribution plate facing the substrate support assembly fabricated from bulk Yttrium, the gas distribution plate having a plurality of apertures aligned with a plurality of apertures formed in the ceramic plug; and
   a substrate support assembly disposed in the chamber body.

2. The processing chamber of claim 1, wherein the substrate support assembly further comprises:
   an electrostatic chuck; and
   a thermal regulating plate disposed below the electrostatic chuck and having at least two independently controllable temperature zones.

3. The processing chamber of claim 1, wherein at least two of the independently controllable temperature zones are laterally spaced.

4. The processing chamber of claim 1 further comprising:
   a liner isolating sides of the substrate support assembly from the interior volume of the chamber body, the liner having an upper larger diameter section and a lower smaller diameter section.

5. The processing chamber of claim 4, wherein the liner comprises Yttrium.

6. The processing chamber of claim 4, wherein the liner comprises $Y_2O_3$.

7. The processing chamber of claim 4 further comprising:
   a cover ring disposed on the substrate support assembly and having two downwardly oriented ridges defining a slot capturing an upper end of the liner.

8. The processing chamber of claim 1 further comprising:
   a plurality of plasma power sources coupled to the substrate support assembly.

9. The processing chamber of claim 8, further comprising:
   a plurality of magnets disposed around the chamber body.

10. The processing chamber of claim 1 further comprising:
    a gas panel having a plurality of gas sources coupled to a mixing manifold, the mixing manifold fluidly coupled to the plenums of the showerhead assembly; and
    a least one direct injection gas fluidly coupled to at least one of the plenums and bypassing the mixing manifold.

11. The processing chamber of claim 1 further comprising:
    a mixing manifold;
    a plurality of first gas sources coupled to the mixing manifold;
    a flow controller fluidly coupled between the mixing manifold and the plenums of the showerhead assembly, the flow controller configured to control the ratio of gas flow to the plenums.

12. The processing chamber of claim 11 further comprising:
    a least one direct injection gas fluidly coupled to at least one of the plenums and bypassing the mixing manifold.

13. The processing chamber of claim 11, wherein the showerhead assembly further comprises:
    a gas distribution plate facing the substrate support assembly fabricated from bulk Yttrium.

14. A processing chamber comprising:
    a chamber body assembly having an interior volume;
    a showerhead assembly coupled to a ceiling of the chamber body and having an inner gas flow plenum and an outer gas flow plenum, the plenums being fluidly isolated, and a region transmissive to an optical metrology signal, the transmissive region comprising a ceramic plug having a plurality of apertures, the showerhead assembly further comprising a gas distribution plate having a plurality of apertures aligned with the apertures formed in the ceramic plug;
    a substrate support assembly disposed in the chamber body and having at least two independently controllable laterally spaced temperature zones;
    an optical metrology system arranged to view the interior volume of the chamber body through the plurality of apertures of the ceramic plug and the plurality of apertures of the gas distribution plate of the showerhead assembly;
    a bias power source coupled to the substrate support assembly;
    at least two plasma power sources coupled to the substrate support assembly;
    a gas panel having a plurality of gas sources coupled to a mixing manifold, the mixing manifold fluidly coupled to the plenums of the showerhead assembly; and
    a least one direct injection gas source fluidly coupled to at least one of the plenums and bypassing the mixing manifold.

15. The processing chamber of claim 14 further comprising:
    a wall liner isolating an interior wall of the chamber body from the interior volume; and an inner liner isolating sides of the substrate support assembly from the interior volume, wherein the liners are formed from, or coated with, Yttrium, a Yttrium alloy or an oxide of Yttrium.

16. The processing chamber of claim 15 further comprising:
a ceramic cover ring disposed on the substrate support assembly and having two downwardly oriented ridges defining a slot capturing an upper end of the inner liner.

17. The processing chamber of claim 14 further comprising:
a flow controller fluidly coupled between the mixing manifold fluidly and the plenums of the showerhead assembly, the flow controller configured to control the ratio of gas flow to the zone.

18. The processing chamber of claim 17 wherein the at least one direct injection gas source is only coupled to at least one of the plenums between the flow controller and the showerhead assembly, bypassing the mixing manifold.

19. The processing chamber of claim 14, wherein the showerhead assembly further comprises:
a plurality of showerhead plates having the plenums defined therein;
wherein the gas distribution plate faces the substrate support assembly and fabricated from bulk Yttrium; and
wherein the ceramic plug is disposed through the center of at least one of the showerhead plates and having the transmissive region defined therein.

20. A processing chamber comprising:
a chamber body assembly having an interior volume;
a gas distribution plate disposed in the interior volume and having a lower side and an upper side, the gas distribution plate having an outer set of gas flow holes, and inner set of gas flow holes, and a set of optical metrology holes;
an inner gas flow zone fluidly coupled to the interior volume through the first set of gas flow holes;
an outer gas flow zone fluidly isolated from the inner zone and coupled to the interior volume through the second set of gas flow holes;
a ceramic plug disposed on the upper side of the gas distribution plate and having a plurality of holes aligned with the optical metrology holes;
a window aligned with the plug;
a substrate support assembly disposed in the chamber body and having at least two independently controllable laterally spaced temperature zones, the substrate support assembly facing the lower side of the gas distribution plate;
an optical metrology system arranged to view the interior volume of the chamber body through an optical passage defined by the window, the holes in the plug and optical metrology holes;
a bias power source coupled to the substrate support assembly; and
at least two plasma power sources coupled to the substrate support assembly.

21. The processing chamber of claim 20, wherein the gas distribution plate comprises Yttrium.

22. The processing chamber of claim 20, wherein the gas distribution plate comprises $Y_2O_3$.

* * * * *